United States Patent [19]

Aimar

[11] 4,197,572
[45] Apr. 8, 1980

[54] DEVICE FOR ENGAGEMENT AND DISENGAGEMENT OF PRINTED CIRCUIT CARDS

[75] Inventor: Michele Aimar, Turin, Italy

[73] Assignee: ITW Fastex Italia, S.P.A., Turin, Italy

[21] Appl. No.: 906,800

[22] Filed: May 17, 1978

[30] Foreign Application Priority Data

Jun. 1, 1977 [IT] Italy .............................. 24260 A/77

[51] Int. Cl.² ............................................ H05K 7/14
[52] U.S. Cl. ................................. 361/399; 339/45 M
[58] Field of Search ............... 29/764, 758; 339/45 R, 339/45 M, 75 MP; 361/415, 412, 413, 399

[56] References Cited

U.S. PATENT DOCUMENTS

| 3,784,954 | 1/1974 | Grimm et al. | 361/399 X |
| 4,064,551 | 12/1977 | Lightfoot | 361/399 |

Primary Examiner—Carl E. Hall
Attorney, Agent, or Firm—Jack R. Halvarsen; Robert W. Beart

[57] ABSTRACT

A device for engaging in and disengaging printed circuit cards from the associated card holding frame is provided, which comprises at least an operating lever and at least a card guide element having at each of its ends a head portion, the guide element head portion facing the outside of the card holding frame being provided with means for receiving by snap action said operating lever, said operating lever having a means for engagement with the card so that the rotation of the operating lever causes the card to be engaged in or disengaged from the card guide element.

6 Claims, 4 Drawing Figures

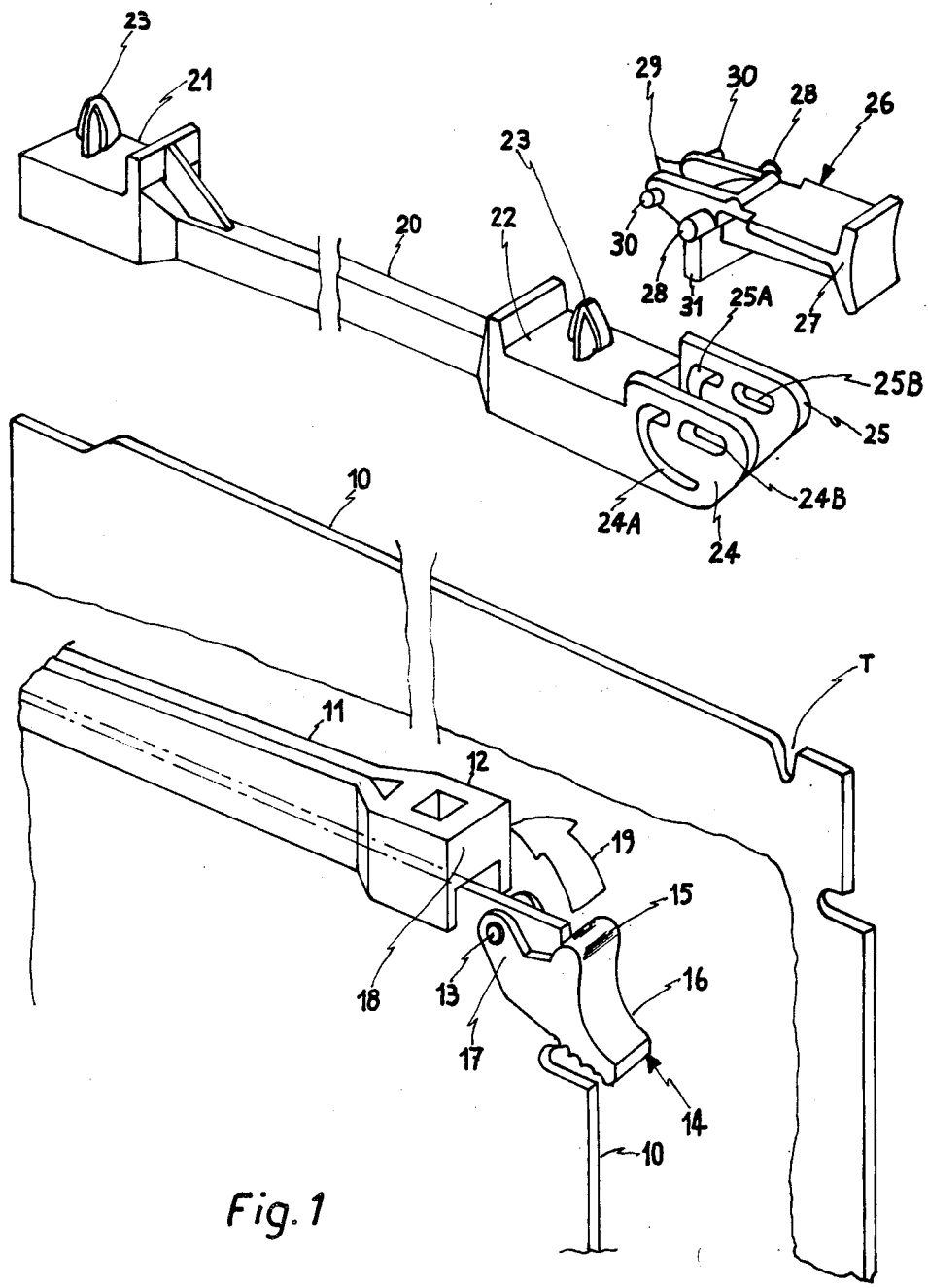

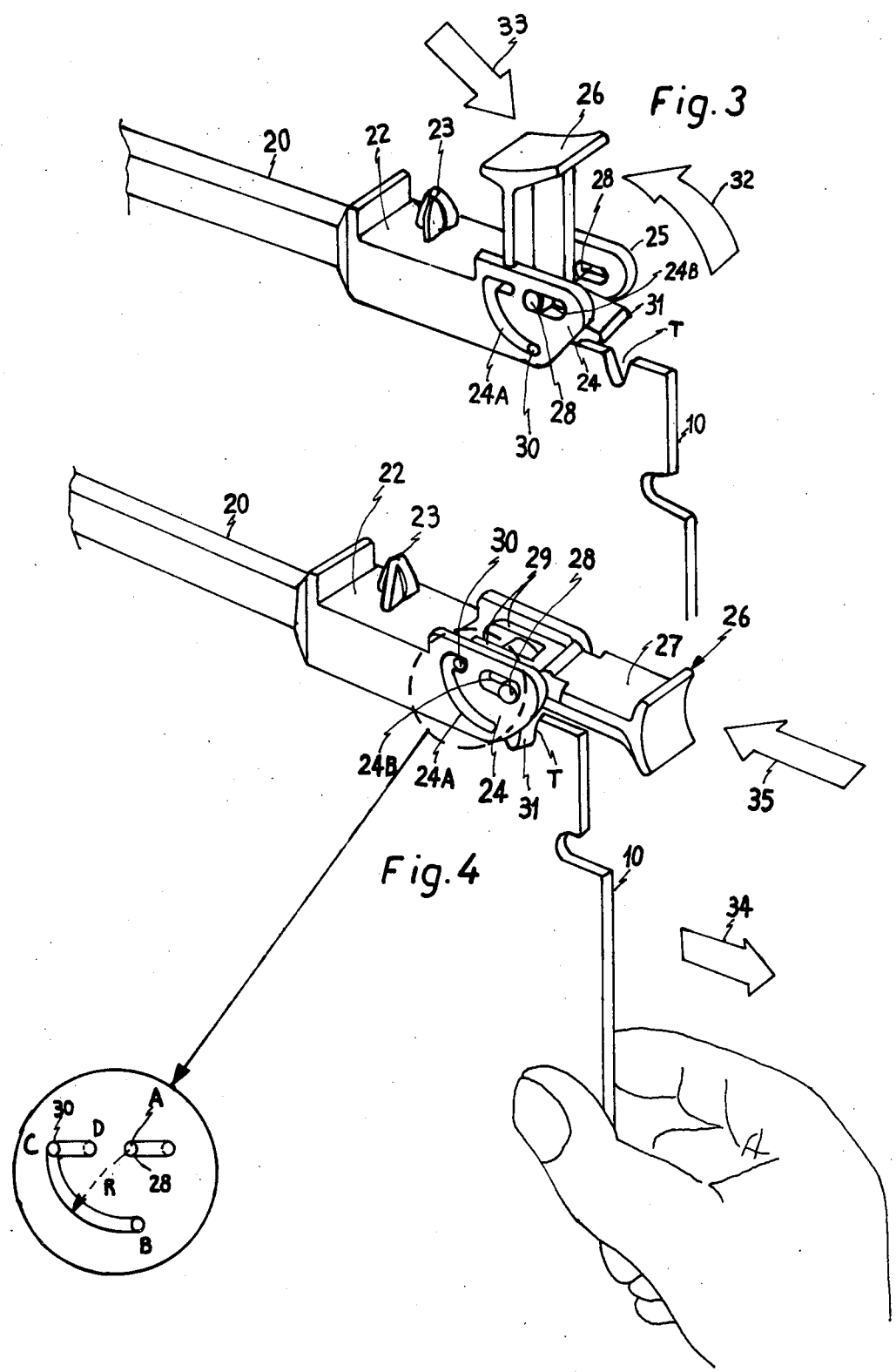

DEVICE FOR ENGAGEMENT AND DISENGAGEMENT OF PRINTED CIRCUIT CARDS

This invention relates generally to electronic apparatus operating with printed circuit cards and particularly a device for engaging and disengaging printed circuit cards from card holding frames.

It is known that printed circuit cards are engaged in card holding frames generally fastened to a wall so that the card contacts are inserted on corresponding contacts of the connectors secured to the card socket located within said frames. In order to obtain the necessary spacing from card to card guide elements are provided which are secured to the frames in which the cards are slidably inserted. In order to attain an optimum electric contact between the contacts of cards and those of connectors secured to the card socket it is necessary that an important force should be exerted upon the cards both during the engagement and the disengagement thereof. If these operations are carried out by hand there is the danger that the cards are damaged also because sometime the card holding frames are placed in positions which are of difficult access to the operator.

In order to obviate this drawback cards have been provided having at each of the two corners facing the outside of the frame a lever pivotally connected at one end to the card. These levers have intermediate the ends thereof a projection intended to bear against the end of the card guide element. The engagement of cards in this case is made by hand, whereas for the card disengagement it is resorted to these levers. By pivoting the levers outwardly the projection will bear against the associated guide end and by further applying a force on the lever the projection will act as a fulcrum of a first class lever, so that the card will be forced out of the guide elements until the card contacts will be disengaged from the card socket contacts, and thereafter the card can readily be caused to slide out of the card holding frame for the necessary maintenance.

This device, while substantially facilitating the disengagement of the card, does not permit the latter to be engaged so that for engaging again the card, the latter is to be pushed directly by hand, as usual, without resorting to the lever, with the result that during the engagment, the card could be damaged.

Starting from this system this invention aims to provide a new device which permits the card engagement and disengagment to be accomplished with a minimum of force while permitting the card to be locked in an inserted position thereby preventing a card from being extracted by hand which, as already mentioned, could result in a card damage.

More particularly the device according to this invention is characterized in that the device comprises at least an operating lever and at least a card guide element having at each of its ends a head portion, the guide element head portion facing the outside of the card holding frame being provided with means for receiving by snap action said operating lever, said operating lever having a means for engagement with the card so that the rotation of the operating lever causes the card to be engaged in or disengaged from the card guide element.

According to a feature of the invention the lever receiving head portion of card guide element is provided also with means for locking the operating lever in a position wherein the card is engaged in the frame.

According to another feature of this invention each of the head portions of the card guide element is provided with means for fastening by snap action the card guide element to the card holding frame.

The invention will be now further described in connection with a preferred embodiment thereof, given merely by way of example, illustrated in the accompanying drawings, in which:

FIG. 1 shows a diagrammatic perspective view of a prior art device for the disengagement of printed circuit cards from the card holding frame;

FIG. 2 shows a diagrammatic perspective view of the device according to the invention for the engagement in and the disangagement of printed circuit cards from the card holding frame; and FIGS. 3 and 4 show partially in a perspective view the device according to the invention in two different positions.

Referring now to FIG. 1, there is shown a prior art device for disengagement of cards from the card holding frame. As can be seen card 10 is inserted in a guide element 11 having at each of its ends a head portion 12. At the outer corner of card 10 a lever 14 is pivotally mounted at 13, which lever has a bifurcated arm 17 and an intermediate projection 15. Card 10 is inserted by hand into the guide elements 11 fastened to the card holding frame (not shown) and when it is desired to extract the card the arm 16 of lever 14 is operated so that the lever pivots in the direction of arrow 19, namely counterclockwise in FIG. 1 until projection 15 comes to rest against the front side 18 of the head portion 12. At this point the projection 15 acts as a fulcrum and as the lever 14 pivots counterclockwise, it will act as a first class lever causing the card 10 to be disengaged from the guide elements 11. Therefore, it can be seen that lever 14 acts during the card disengagement only.

The device according to the invention is shown in FIG. 2. This device comprises a card guide element 20 having at each of its ends a head portion 21 and 22 respectively. Both head portions 21 and 22 are each provided on the top side thereof with a snap acting anchor element 23 integrally formed with the head portion, which anchor elements are intended to be inserted by snap action into associated holes provided on the frame wall (not shown). The head portion 22 has also a pair of lugs 24 and 25 extending from the front side of head portion 22. Lugs are disposed substantially parallel to each other and each lug has two slots 24A, 24B and 25A, 25B respectively, the function of which will be discussed below.

The device comprises also a lever 26 having an actuating arm 27, a pair of intermediate pivot pins 28 laterally extending therefrom, a bifurcated arm 29 having a pair of guide pins 30 laterally extending therefrom and a tooth 31 extending at right angles from both arms 27 and 29. Lever 26 is intended to be inserted by snap action between the lugs 24 and 25 of head portion 22, namely so that the pivot pins 28 of lever 26 enter the slots 24B and 25B of lugs and the guide pins 30 enter the slots 24A and 25A of lugs.

As best seen from the detail encircled in FIG. 4, slot 24A comprise an arc-shaped segment BC having a radius centered at A, i.e. at the left end of slots 24B, and a straight segment CD whereas slots 24B are straight and have the same length as that of the straight segment CD of slots 24A. In this manner, as the pivot pins 28 of lever 26 lie at the left end of slots 24B guide pins 30 can slide along the arc-shaped slots 24A thus permitting the lever 24 to be pivoted in the direction of arrow 32 of FIG. 3, i.e. counterclockwise, or in the reverse direction, while as pivot pins 28 of lever 26 lie at the right end of slots 24B, guide pins 30 of lever 26 lie at the right end of the straight segment BC of slots 24A and therefore lever 26 can no longer rotate.

The operation of the device according to the invention is very simple. Once the guide element 20 is applied on the card holding frame by causing the anchor elements 23 to snap into the associated holes provided on the frame wall the head portion 22 will project from the frame. When it is desired to insert a card 10 into the respective guide element 20, it will be sufficient to pivot the lever 26 in the position shown in FIG. 3 with guide pins 30 resting at the bottom of arc-shaped slots 24A, 25A and pivot pins 28 at the left end of slots 24B, 25B. The actuating arm 27 of lever 26 will be vertically positioned and tooth 31 will be horizontally positioned. Then, card 10 is inserted into the guide element 20 until contacts at the bottom of card 10 begin to come in contact with those of connectors of the card socket. At this point a notch T provided in card on the side facing the lever 26 will be in front of the tooth 31. Now, by acting on the lever arm 27 in the direction shown by the arrow 33 in FIG. 3, i.e. by pivoting the lever 26 clockwise, the tooth 31 will enter the notch T of card 10 and will force the card to completely enter the card socket. At this point guide pins 30 of lever 26 will lie at point C of slots 24A, 25A (FIG. 4). Now, by exerting a traction on the lever arm 27 guide pins 30 will displace to the point D of the straight segment CD of slots 24A, 25A and pivot pins 28 will lie at the right end of straight slots 24B, 25B so that, if an attempt is made to extract by hand the card 10 in the direction of arrow 34 of FIG. 4, card 10 cannot exit from the associated guide elements because lever 26 can no longer rotate.

Of course, this displacement of lever in a locked position can be automatically accomplished by providing a spring means between the lever 26 and the front side of head portion 22 biasing the lever outwardly when pins 28 and 30 lie at the beginning of straight segment CD of slots 24A, 24B and at the begin of slots 25A, 25B, respectively.

In order to disengage the card 10 it will be sufficient to urge the lever 26 in the direction of arrow 35 in FIG. 4 so that guide pins 30 will be displaced from point D to point C of the straight segment CD of slots 24A, 24B and pivot pins 28 will be displaced from the right end to the left end of the straight slots 24B, 25B. In this position of pins 28 and 30 lever 26 can be pivoted in the direction of arrow 32 in FIG. 3, i.e. counterclockwise, and tooth 31 in the notch T of card 10 will cause the extraction of card 10 from the card socket.

By suitably sizing the lever arms a substantial advantage can be achieved to reduce the engagement and disengagement force of card 10.

By way of example, assuming that the engagement and disengagement force will be of about 12 Kg. and assuming that lever 26 is a first class lever, with a ratio between the levers arms of 1:3 the force necessary to accomplish both operations can be reduced by at least ⅓.

Thus, there is provided an improved device for engagement and disengagement of printed circuit cards, which has the following advantages relative to the known systems:

(1) Lever 26 is applied by a snap action on the card guide element so that card moving parts requiring a card working step for their application are eliminated.

(2) For introducing the card with lever in open position, the latter is lowered thus facilitating the card insertion.

(3) When the lever is in a closure position, the card can no longer be extracted directly by hand, since the above mentioned locking means are provided.

While a preferred embodiment of the invention only has been shown it should be understood that all the changes and modifications within the scope of the appended claims can be made thereto.

I claim:

1. A device for use with a printed circuit card holding frame, characterized in that the device comprises at least an operating lever and at least a card guide element having at each of its ends a head portion, the guide element head portion facing the outside of the card holding frame being provided with means for receiving said operating lever, said operating lever having means for cooperative engagement with a printed circuit card so that appropriate rotation of the operating lever will cause a card to be locked in the card guide element, while rotation of said lever in an opposite direction will eject a card, said lever receiving head portion of said card guide element being also provided with means for locking the operating lever in a predetermined position when a card is locked in the frame, said means for locking the operating lever includes an arc-shaped first slot provided in a lug extending from each side of the head portion of said card guide element, said arc-shaped slot merging into a straight segment having predetermined length, said slot for receiving guide pins extending laterally from the end of the lever opposite the operating end and intended to slide in said arc-shaped slots, second slot means generally parallel to and spaced from said straight segment and for accepting pivot pins extending laterally intermediate the length of said lever and spaced from said guide pins, so that, as the lever is rotated, the pivot pins lie at one end of said second slot means and the guide pins lie in the arc-shaped segment of the first slots and as the guide pins lie at the straight segment of the first slots the pivot pins are moved towards the opposite end of the straight segment of the second slots.

2. A device according to claim 1, characterized in that each of the head portions of the card guide element is provided with means for fastening by snap action the card guide element to the card holding frame.

3. A device according to claim 1, characterized in that said means provided on the operating lever for engagment with the card is a tooth extending at right angles with respect to the lever and cooperating with a notch provided on said card edge.

4. A device according to claim 2, characterized in that said means for fastening by snap action said card guide element to the card holding frame is an anchor element provided with resilient arms and intended to enter by snap action a hole provided on the card holding frame.

5. A device according to claim 4, characterized in that said anchor element is integrally formed with the head portion of the card guide element.

6. A device according to claim 1, characterized in that said pivot pins and said guide pins on the lever are moved in said other end of the associated slots by means of a spring element arranged between the lever and the head of the card guide element.

* * * * *